United States Patent
Vander Till

(10) Patent No.: US 12,081,022 B2
(45) Date of Patent: Sep. 3, 2024

(54) PLUG-IN POWER DISTRIBUTION UNIT FOR MODULAR ELECTRICAL SYSTEMS

(71) Applicant: Norman R. Byrne, Rockford, MI (US)

(72) Inventor: Gerald N. Vander Till, Grandville, MI (US)

(73) Assignee: Norman R. Byrne, Ada, MI (US)

( * ) Notice: Subject to any disclaimer, the term of this patent is extended or adjusted under 35 U.S.C. 154(b) by 0 days.

(21) Appl. No.: 17/505,220

(22) Filed: Oct. 19, 2021

(65) Prior Publication Data

US 2022/0123554 A1    Apr. 21, 2022

Related U.S. Application Data

(60) Provisional application No. 63/094,339, filed on Oct. 20, 2020.

(51) Int. Cl.
| | | |
|---|---|---|
| *H01R 12/70* | (2011.01) | |
| *H02J 3/00* | (2006.01) | |
| *H05K 7/14* | (2006.01) | |

(52) U.S. Cl.
CPC .......... *H02J 3/007* (2020.01); *H01R 12/7088* (2013.01); *H05K 7/1492* (2013.01)

(58) Field of Classification Search
CPC ............... G08C 17/02; H02J 13/00004; H02J 13/00022; H02J 13/00024; H02J 13/00026; H02J 2310/12; H02J 3/007; Y02E 60/00; Y04S 40/126; H01R 12/7088; H01R 12/7052; H01R 12/727; H01R 13/6594; H01R 13/7172; H01R 13/6581; H01R 13/6587; H05K 7/1492; H02G 3/18

See application file for complete search history.

(56) References Cited

U.S. PATENT DOCUMENTS

| | | | | |
|---|---|---|---|---|
| 5,340,326 | A | * 8/1994 | LeMaster | ............... H01R 25/00 439/540.1 |
| 5,648,712 | A | 7/1997 | Hahn | |
| 5,700,150 | A | * 12/1997 | Morin | .................. H01R 25/003 439/4 |
| 6,830,477 | B2 | 12/2004 | Vander Vorste et al. | |
| 8,235,755 | B2 | 8/2012 | Binder | |
| 9,685,730 | B2 | 6/2017 | Jones et al. | |
| 11,081,815 | B2 | 8/2021 | Byrne et al. | |
| 11,303,079 | B2 | 4/2022 | Byrne et al. | |
| 2008/0142504 | A1 | * 6/2008 | Byrne | .................. A47J 36/2461 219/452.11 |
| 2012/0256496 | A1 | * 10/2012 | DeCosta | .................. H02G 3/12 174/53 |
| 2019/0148850 | A1 | * 5/2019 | Byrne | ..................... G06F 13/38 361/622 |

* cited by examiner

Primary Examiner — Elim Ortiz
(74) Attorney, Agent, or Firm — Gardner, Linn, Burkhart & Ondersma LLP

(57) ABSTRACT

A plug-in power distribution unit is readily installable, removable, and replaceable by skilled or non-skilled persons. The units include one or more conventional electrical power plugs for engaging a conventional wall outlet or the like, and one or more proprietary electrical power connectors for engaging with a compatible connector of a modular electrical power system. Optionally, multiple circuits may be accommodated by the plug-in power distribution unit.

16 Claims, 7 Drawing Sheets

PLUG-IN POWER DISTRIBUTION UNIT FOR MODULAR ELECTRICAL SYSTEMS

CROSS REFERENCE TO RELATED APPLICATION

The present invention claims the benefit of U.S. provisional application Ser. No. 63/094,339, filed Oct. 20, 2020, which is hereby incorporated herein by reference in its entirety.

FIELD OF THE INVENTION

The present invention relates to relates to electrical power distribution systems and, more particularly, to electrical power distribution units that plug into standard outlets.

BACKGROUND OF THE INVENTION

In some areas, particularly finished work areas and the like, it is convenient to route electrical wiring in a modular electrical system behind or along surfaces in a work area, such as beneath raised floors, through room dividers, or along floor or wall surfaces. Such modular electrical systems are typically hard-wired into a building's electrical power supply and thus require a skilled person to install, move, or reconfigure.

SUMMARY OF THE INVENTION

The present invention provides a plug-in power distribution unit that can be plugged directly into a conventional electrical wall outlet (or floor or ceiling outlet) to provide electrical power into a modular electrical power distribution system in a work area. This avoids the need for a hard-wired electrical power supply by allowing for a distribution unit that is readily removed and reinstalled at a compatible receptacle substantially anywhere a suitable receptacle is located, which allows a modular electrical system to be relocated more easily within a work area, including by relatively unskilled labor. Proprietary output connectors, which may include keying features, ensure compatibility with a desired modular electrical system while improving safety by reducing the risks of electrical overload, for example.

According to one form of the present invention, a plug-in power distribution unit includes housing, a conventional power-receiving electrical plug, a modular electrical power output connector, electrical conductors extending from the electrical plug to the output connector, and a mounting bracket. The housing has a top surface, a pair of opposing side surfaces, a bottom surface, a front surface, and a rear surface, which cooperate to define an interior chamber. The power-receiving plug projects from the rear surface of the housing and is designed to engage a conventional high voltage AC electrical outlet, such as a wall or floor outlet. The mounting bracket is coupled to the housing and extends along the rear surface thereof, allowing the unit to be releasably secured to the conventional high-voltage AC electrical outlet.

These and other objects, advantages, purposes and features of the present invention will become apparent upon review of the following specification in conjunction with the drawings.

DETAILED DESCRIPTION OF PREFERRED EMBODIMENTS

Figure 1:
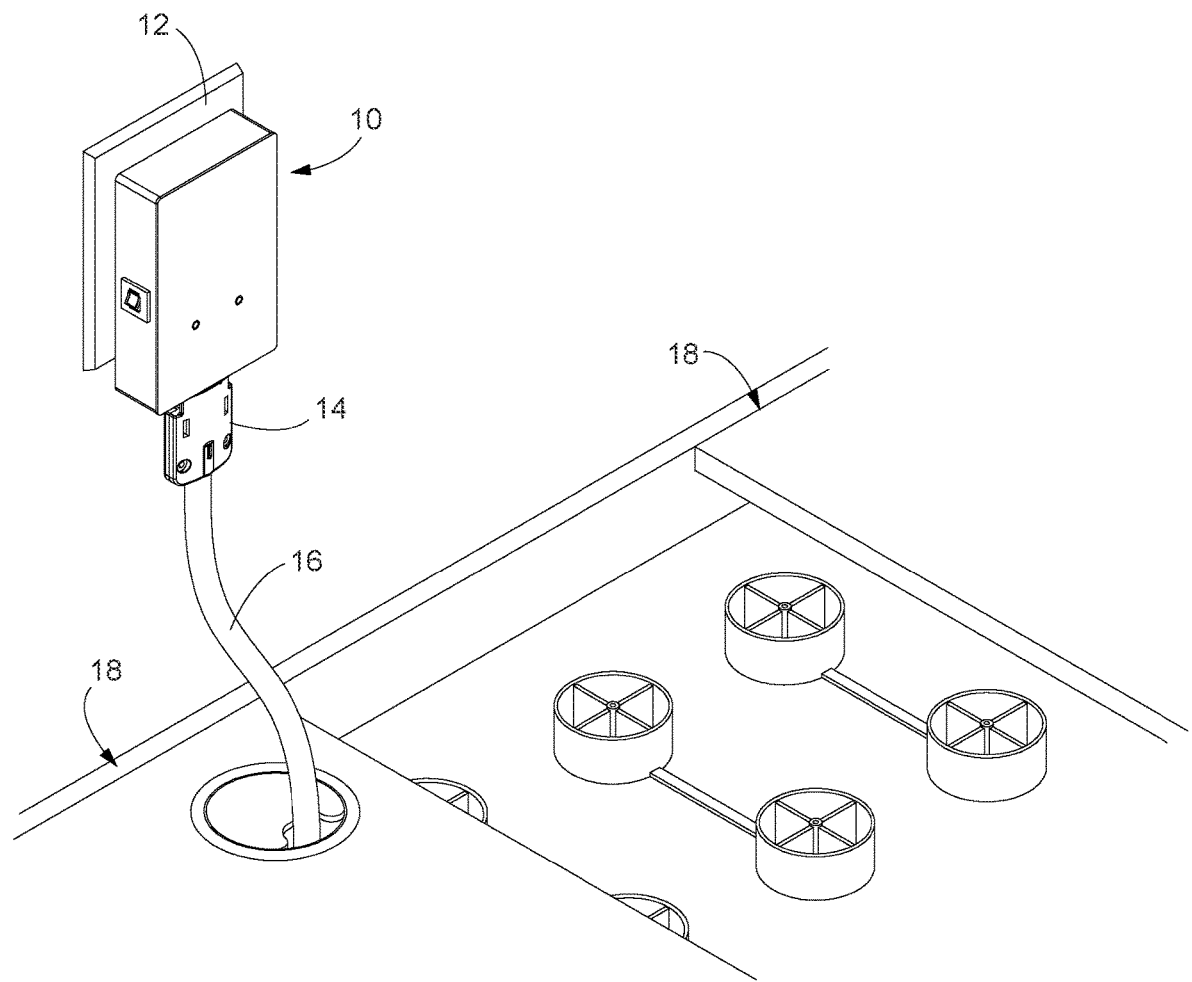
FIG. 1 is a top perspective view of a plug-in power distribution unit in accordance with the present invention, shown coupled to a modular electrical system of a raised floor system.

Referring now to the drawings and the illustrative embodiments depicted therein, a plug-in power distribution unit 10 plugs into and receives electrical power from a conventional wall outlet 12, such as shown in FIG. 1. The plug-in power distribution unit 10 directs the power received from wall outlet 12 to a modular receiving connector 14 and cord 16 of a modular electrical system, which may be disposed below a raised floor system 18, and/or through workstation walls, for example. Other such floor systems and modular electrical systems are more fully described in commonly-owned U.S. Pat. No. 7,183,504 and U.S. patent application, Pub. No. 2019/0148850, now U.S. Pat. No. 11,081,815, the disclosures of which are hereby incorporated herein by reference. In the illustrated embodiment, the plug-in power distribution unit 10 includes at least one conventional NEMA plug 20 along its rear panel 22 (FIGS. 3 and 4) for engaging a NEMA receptacle of the conventional wall outlet 12. The plug-in power distribution unit 10 obviates the typical need for a hard-wired electrical power supply for a conventional modular electrical system, since the distribution unit 10 can be readily removed and reinstalled at a compatible receptacle substantially anywhere a suitable electrical receptacle is located, whether that is in a permanent wall, a room divider wall, a floor, or a ceiling. This also allows a modular electrical system to be relocated more easily within a work area, without need for making changes to any hard-wired electrical system components.

The plug-in power distribution unit 10 directs power to an output connector 24, which is a proprietary modular connector that is compatible for use with the selected modular electrical system, such as the 4-TRAC® system available from Byrne Electrical Specialists, Inc. of Rockford, Mich. The use of the proprietary output connector 24 ensures that only an electrically compatible modular electrical system may be electrically coupled to the power distribution unit 10, in order to reduce the risk of electrical overload or other compatibility problems.

Throughout the remainder of this description and in the claims, it should be understood that directional terms such as "top", "bottom", "front", "back", "left", and "right" are relative terms used for ease of understanding with reference to the drawings, and are not intended to be limiting, as the plug-in power distribution units could be installed in substantially any orientation. The plug-in power distribution unit 10 includes a perimeter housing 26 including left and right sides 26a, 26b, a top portion 26c and a bottom portion 26d, such as shown in FIGS. 2-5. In the illustrated embodiment, the perimeter housing's left side 26a defines an opening 28 (FIG. 5) that receives a circuit breaker 30 electrically disposed between the conventional NEMA plug 20 and the proprietary output connector 24 to provide additional overload protection. The perimeter housing's lower portion 26d defines an elongated opening 32 through which a portion of the proprietary output connector 24 passes.

Figure 2:
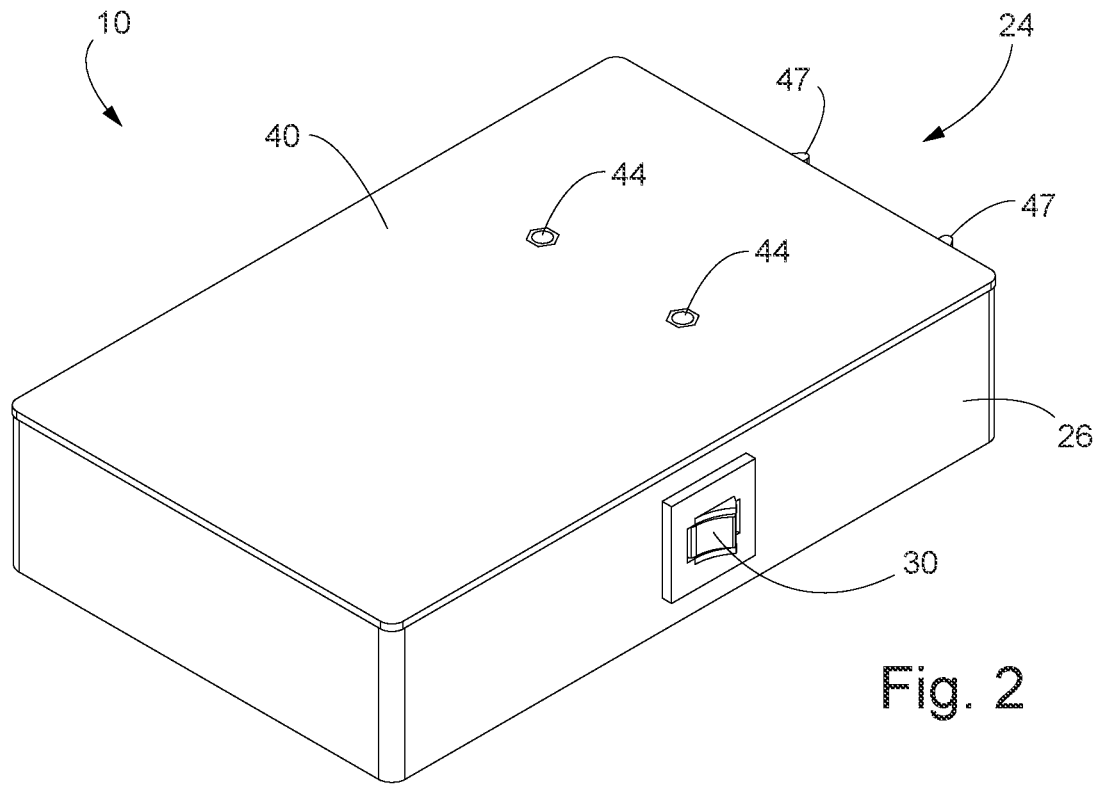
FIG. 2 is another top perspective view of the plug-in power distribution unit of FIG. 1.
Figure 3:
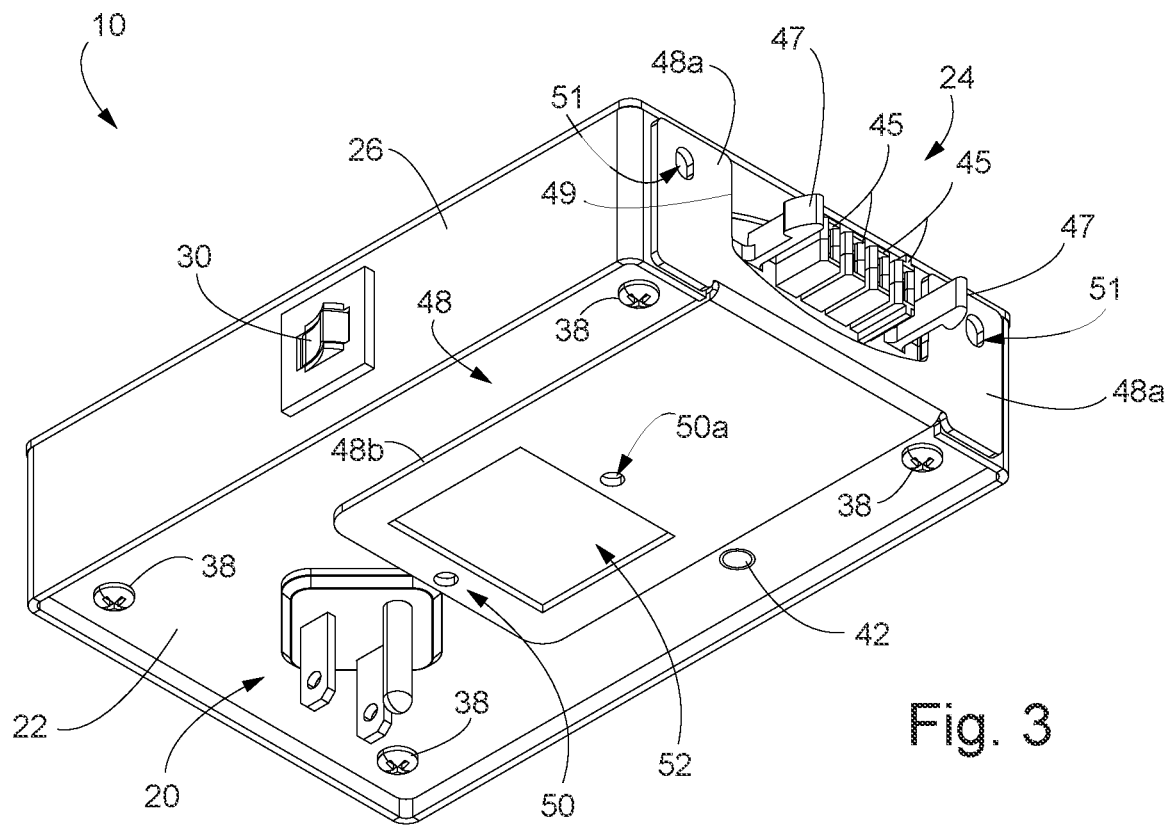
FIG. 3 is a rear perspective view of the plug-in power distribution unit.
Figure 4:
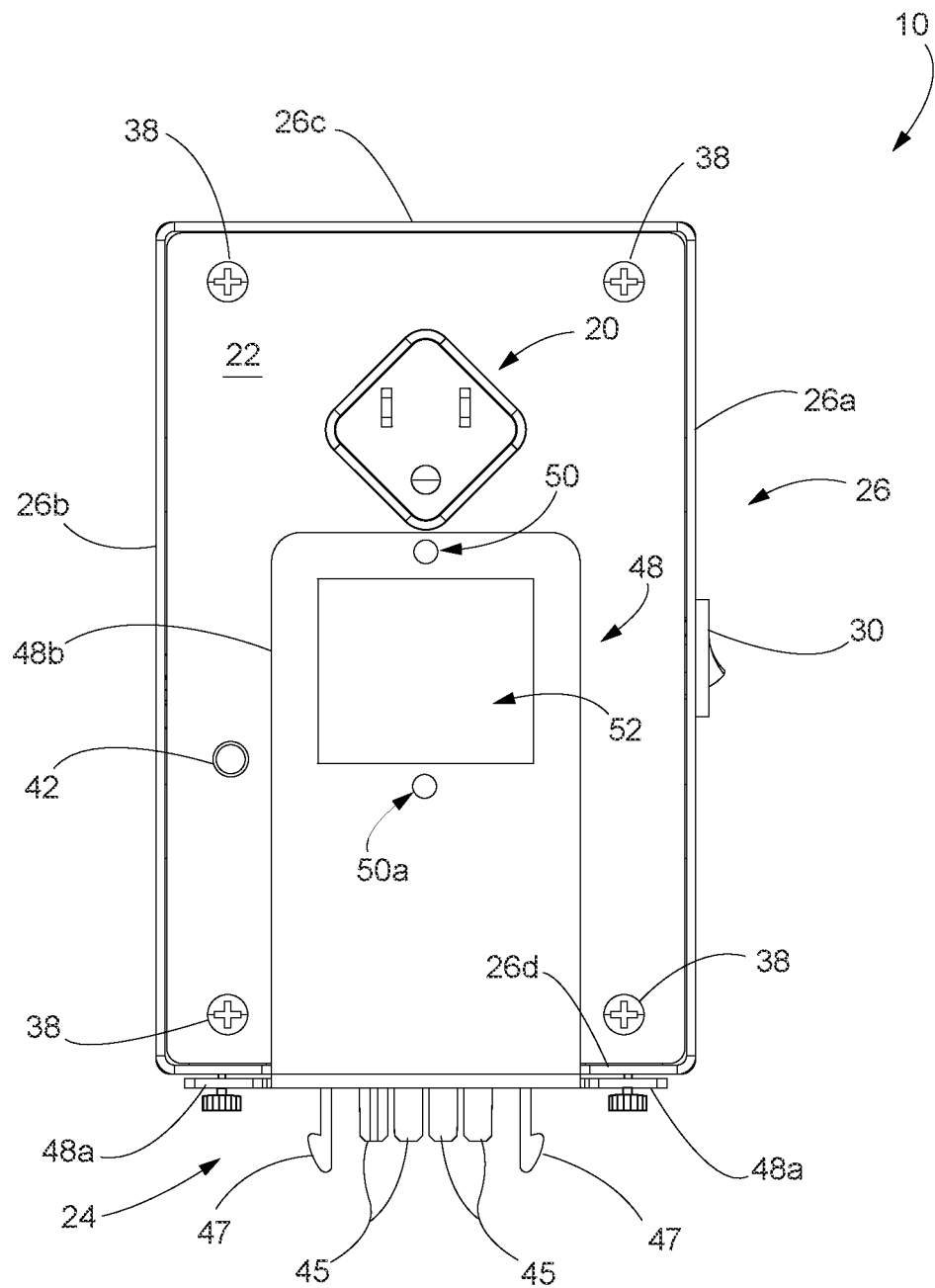
FIG. 4 is a rear elevation of the plug-in power distribution unit.
Figure 5:
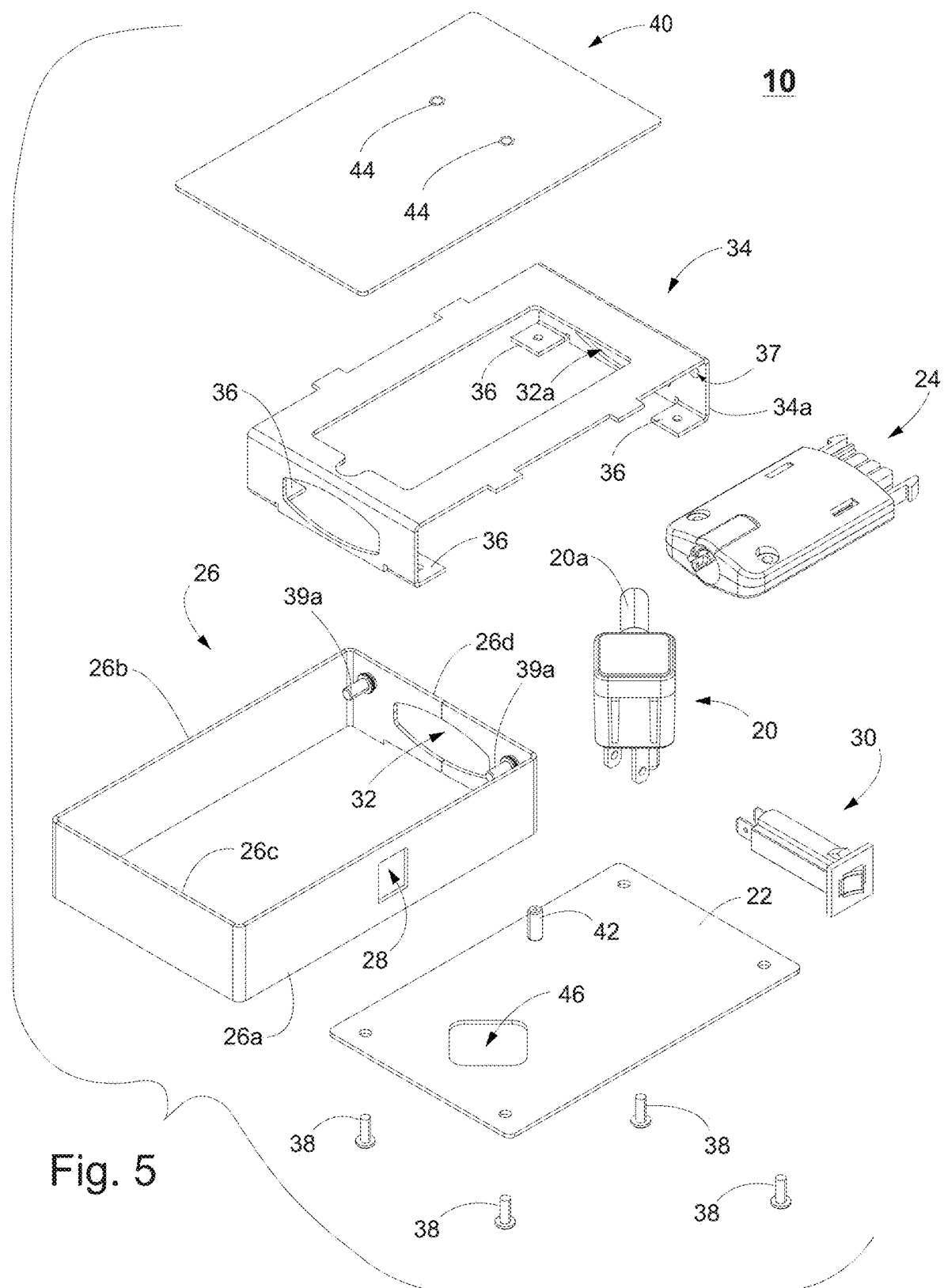
FIG. 5 is an exploded perspective view of the plug-in power distribution unit.

An internal frame or bracket piece 34 (FIG. 5) fits inside the perimeter housing 26 and includes tabs 36 with threaded bores for receiving respective threaded fasteners 38 that secure the rear panel 22 and enclose a rear portion of the plug-in power distribution unit 10 as shown in FIGS. 3 and 4. Internal frame 34 has a lower panel 34a defining a central opening 32a for receiving output connector 24, and another opening 37 on each side of central opening 32a, the additional openings 37 for receiving respective threaded receivers 39a (e.g., self-clinching blind nuts), corresponding to a pair of thumb screws 39 (FIG. 4), which are discussed below. A front or outer panel 40 covers a front region of the internal frame or bracket piece 34 and is secured there to enclose or cover the front edges of the perimeter housing 26. In the illustrated embodiment, a threaded screw boss 42 extends forwardly from the rear panel 22 provides a mount for an electrical grounding wire associated with plug 20. Other couplers (not shown) may engage fasteners 44 (e.g., self-clinching blind nuts) at openings formed in the front panel 40, such as shown in FIGS. 2 and 5. An opening 46 is formed or established in the rear panel 22, through which at least the prongs of the conventional NEMA plug 20 extend rearwardly (FIGS. 3 and 5). A cord 20a is attached to plug 20 (FIG. 5) and contains electrical conductors that pass through the housing 26 to the output connector 24, with a ground wire branching off to screw boss 42.

In the illustrated embodiment of FIGS. 1-5, the proprietary output connector 24 includes female electrical contacts housed within hollow insulated projections 45, and a pair of resilient latch tabs 47 that releasably secure to the compatible male power-receiving connector 14, so that the receiving connector 14 cannot be inadvertently pulled out of engagement with the output connector 24. The perimeter housing 26, rear panel 22, internal frame or bracket piece 34, and front panel 40 are sized and shaped to permit the use of the conventional NEMA plug 20 and one or more different proprietary output connectors 24 that may also be compatible for use in other applications ranging from electrical extension cords to the aforementioned modular electrical systems.

Referring to FIGS. 3 and 4, an additional L-shaped bracket 48 may be provided for added security and support of the plug-in power distribution unit 10 at the wall outlet 12. The bracket 48 includes a lower portion 48a extending along an exterior of the perimeter housing's lower portion 26d and providing a cutaway region 49 for the proprietary output connector 24, plus a pair of openings 51 that receive threaded receivers 39a and the threaded shafts of thumb screws 39. The thumb screws' threaded shafts extend upwardly through (and threadedly engaging) threaded receivers 39a at bottom portion 26d of perimeter housing 26, to secure bracket 48 to perimeter housing 26. After passing through perimeter housing 26, the thumb screws' shafts also pass through openings 37 formed in lower panel 34a of inner frame 34. An upright portion 48b extends along the rear panel 22 and includes an upper bore 50, below the NEMA plug 20, through which a threaded fastener may be inserted and secured to the conventional wall outlet 12, such as at a threaded bore normally used to secure a wall outlet cover plate to the wall receptacle. Another bore 50a may be provided for a similar purpose as bore 50, such as for securing the bracket 48 to an electrical outlet box, or for securing the bracket 48 to the rear panel 22. The L-shaped bracket 48 is secured to the power distribution unit 10 by fasteners such as thumbscrews 39, or the power distribution unit 10 may be unattached to the bracket while resting upon the bracket's lower portion 48a for support. A larger opening 52 in the bracket's upright portion 48b provides optional space for a second electrical plug (not shown in FIGS. 3-5), or for access to another outlet when power distribution unit 10 is removed from bracket 48 while the bracket remains attached to the wall outlet 12.

Figure 6:
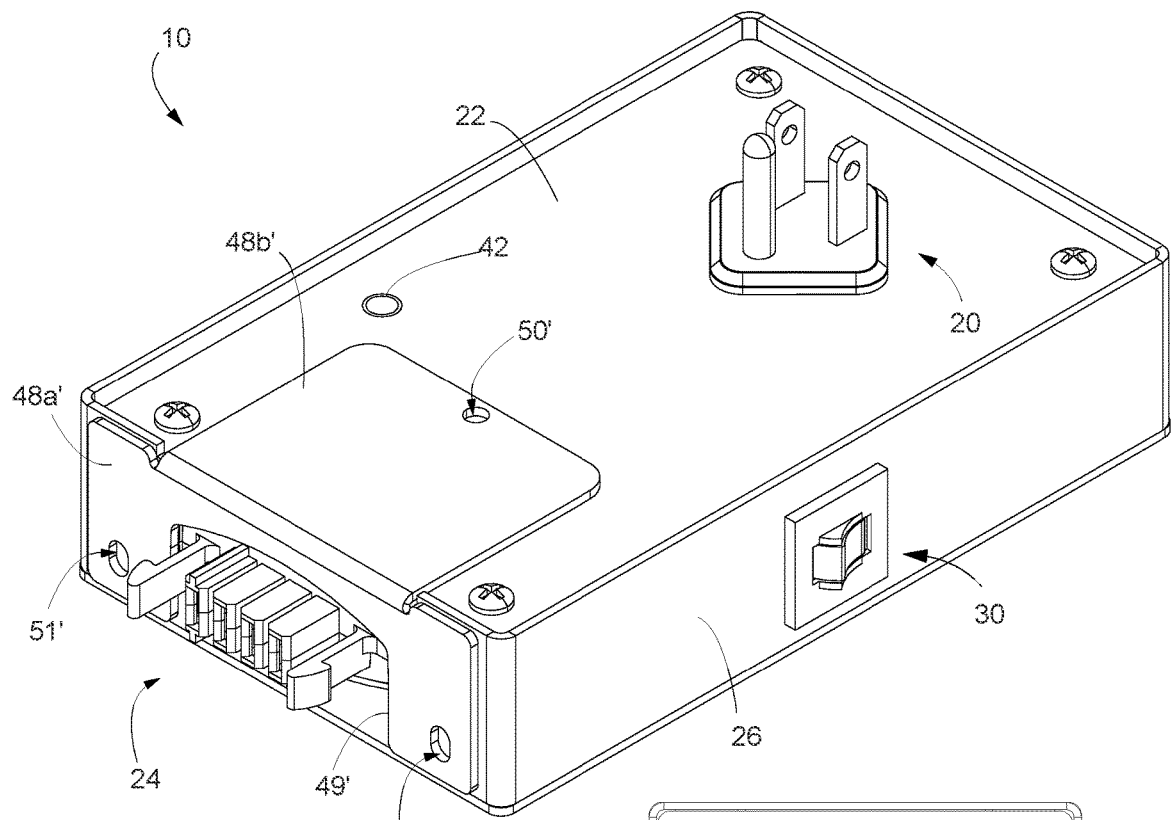
FIG. 6 is a rear perspective view of another plug-in power distribution unit in accordance with the present invention.
Figure 7:
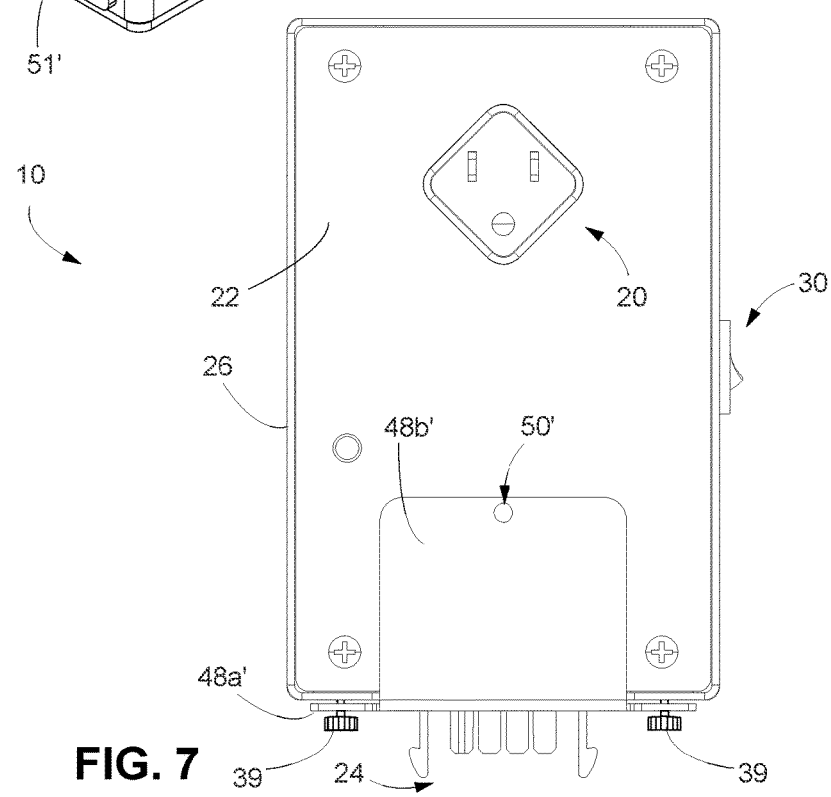
FIG. 7 is a rear elevation of the plug-in power distribution unit of FIG. 6.
Figure 10:
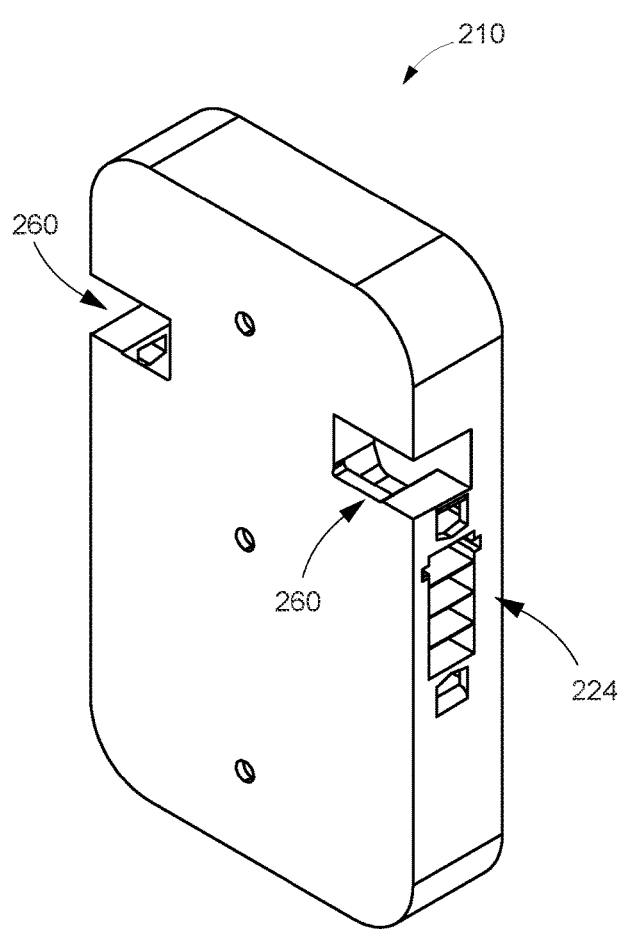
FIG. 10 is a front perspective view of another plug-in power distribution unit in accordance with the present invention.

While L-shaped bracket 48 of FIGS. 3 and 4 is designed for use with a conventional NEMA outlet, another L-shaped bracket 48' of FIGS. 6 and 10 may be provided for compatibility with DECORA® style electrical receptacles, which lack a center mounting screw for a face plate, but instead include top and bottom screws. L-shaped bracket 48' includes a single fastener opening 50' for securing the bracket's upright portion 48b' to a lower face plate bore of a DECORA® style receptacle. The bracket's lower portion 48a' includes a pair of openings 51' for receiving thumbscrews 39, such as shown in FIG. 7, and a cutaway region 49' for receiving the output connector 24.

Figure 8:
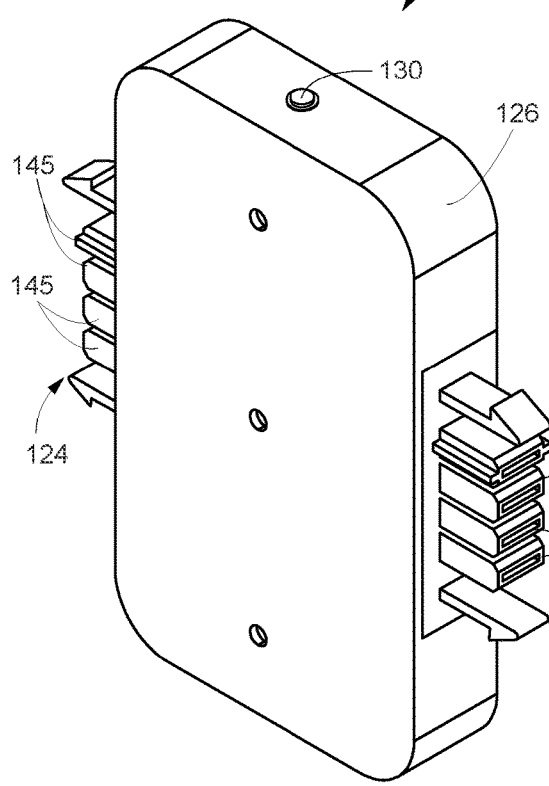
FIG. 8 is a front perspective view of another plug-in power distribution unit in accordance with the present invention.
Figure 9:
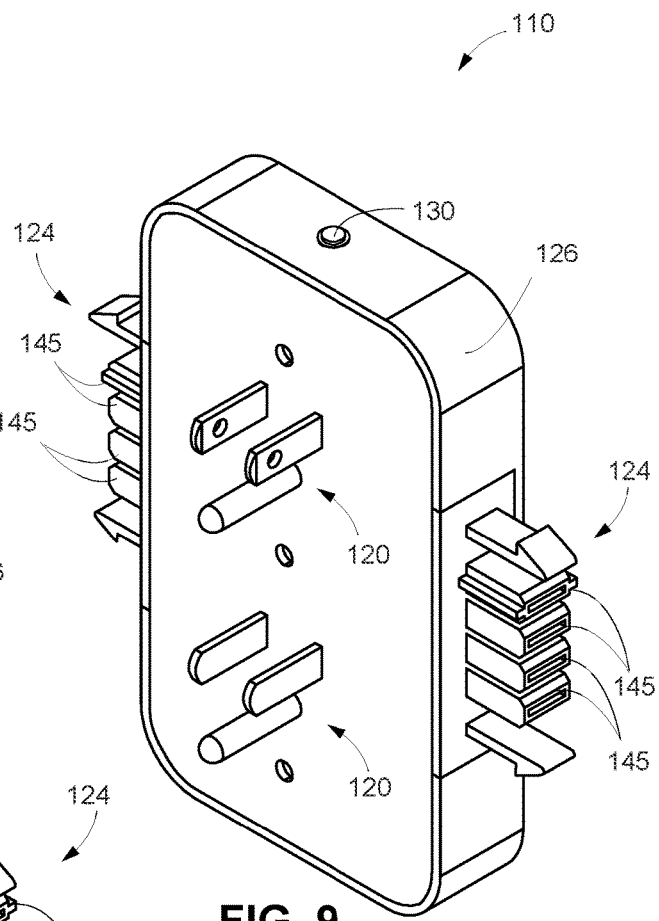
FIG. 9 is a rear perspective view of the plug-in power distribution unit of FIG. 8.

As noted above, a plug-in power distribution unit 110 may be provided with two conventional plugs 120 such as shown in FIG. 9. The plug-in power distribution unit 110 of FIGS. 8 and 9 also includes a pair of proprietary modular output connectors 124 on respective opposite sides of a perimeter housing 126, so that two different modular electrical systems may be powered by the single plug-in power distribution unit 110. It will be appreciated that when two conventional plugs 120 are provided, the distribution unit 110 may be capable of receiving and distributing electrical power on two different electrical supply circuits, provided that the two conventional electrical receptacles that receive the plugs 120 are wired to different circuits. Proprietary output connectors 124 may likewise be capable of supplying electrical power on two different electrical circuits via two different line conductors contained within different electrical contacts housed within hollow insulated projections 145. Appropriate keying of the insulated projections 145 can be used to ensure that the modular electrical systems are compatible with the electrical supply at the selected output connector 124. As with the distribution unit 10 of FIGS. 1-5, the plug-in power distribution unit may include a circuit breaker 130 for load protection, and may optionally include two separate circuit breakers for respective electrical circuits, if appropriate.

Figure 11:
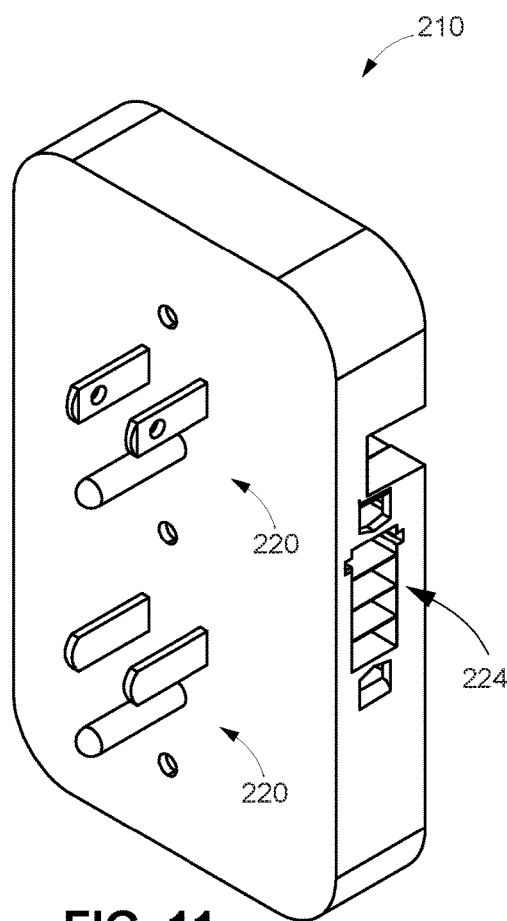
FIG. 11 is a rear perspective view of the plug-in power distribution unit of FIG. 10.

A similar plug-in power distribution unit 210 is illustrated in FIGS. 10 and 11, which includes two conventional NEMA plugs 220 and a pair of recessed male connector interfaces 224. Additional shaped recesses 260 facilitate mechanical securement for an electrical connector of an associated modular electrical system, such an electrical connector having a pair of resilient or releasable fingers (not shown) for engagement with respective recesses 260.

Thus, the plug-in power distribution units of the present invention are readily installable, removable, and replaceable, by skilled or non-skilled persons since no hardwired connections are required for relocation. The units may plug in and optionally mechanically secure to conventional power outlets that are typically found in a work area, and can supply power from two separate circuits if equipped with two separate electrical plugs. Although the embodiments shown and described herein include conventional three-prong 110V AC NEMA plugs, it will be appreciated that substantially any conventional electrical power plugs, typically of 110V or 220V AC, may be used to meet the needs of a particular geographical area, without departing from the spirit and scope of the present invention.

Changes and modifications in the specifically described embodiments may be carried out without departing from the principles of the present invention, which is intended to be limited only by the scope of the appended claims, as interpreted according to the principles of patent law including the doctrine of equivalents.

The embodiments of the invention in which an exclusive property or privilege is claimed are defined as follows:

1. A plug-in power distribution unit comprising:
   a housing having a top surface, a pair of opposing side surfaces, a bottom surface, a front surface, and a rear surface, said surfaces cooperating to define an interior chamber;
   wherein said housing further comprises:
   a perimeter housing defining said top surface, said opposing side surfaces, and said bottom surface;
   a rear panel defining said rear surface;
   a front panel defining said front surface; and
   an inner frame contained within said interior chamber;
   wherein said rear panel is coupled to said inner frame via fasteners;
   a conventional electrical power-receiving plug projecting from said rear surface of said housing, said power-receiving plug configured for engaging a conventional high-voltage AC electrical outlet; and
   a modular electrical power output connector positioned directly at one of said opposing side surfaces or said bottom surface of said housing;
   a plurality of electrical conductors extending from said power-receiving plug, through said interior chamber, to said modular electrical power output connector; and
   a mounting bracket coupled to said housing and extending along said rear surface,
   wherein said mounting bracket is configured to be releasably secured to the conventional high voltage AC electrical outlet;
   wherein said bottom surface of said perimeter housing and a bottom surface of said inner frame define respective openings through which said modular electrical power output connector extends.

2. The plug-in power distribution unit of claim 1, wherein said conventional electrical power-receiving plug comprises a pair of spaced-apart NEMA plugs configured for simultaneous engagement with two spaced-apart NEMA receptacles of the conventional high-voltage AC electrical outlet.

3. The plug-in power distribution unit of claim 1, wherein said mounting bracket comprises:
   an upper leg extending along said rear surface of said housing, said upper leg defining an opening for receiving a fastener to secure said upper leg to a threaded bore in the conventional high-voltage AC electrical outlet; and
   a lower leg extending along said bottom surface of said housing, wherein said lower leg defines an opening for receiving a fastener to secure said lower leg to a threaded bore at said bottom surface.

4. The plug-in power distribution unit of claim 3, wherein said lower leg defines a cutaway region for receiving said modular electrical power output connector, and further defines two of said openings for receiving a fastener, one on each opposite side of said cutaway region, said mounting bracket further comprising a pair of thumbscrews for securing said lower leg to said bottom surface of said housing.

5. The plug-in power distribution unit of claim 1, further comprising a circuit breaker disposed along one of said electrical conductors, wherein said circuit breaker is accessible along said housing.

6. The plug-in power distribution unit of claim 1, wherein said modular electrical power output connector comprises a pair of modular electrical power output connectors at each of said opposing side surfaces of said housing.

7. The plug-in power distribution unit of claim 1, wherein said mounting bracket comprises:
   an upper leg extending along said rear surface of said housing, said upper leg defining an opening for receiving a fastener to secure said upper leg to a threaded bore in the conventional high-voltage AC electrical outlet; and
   a lower leg extending along said bottom surface of said housing, wherein said lower leg defines a fastener opening for receiving a fastener to secure said lower leg to a threaded bore at said bottom surface.

8. The plug-in power distribution unit of claim 7, wherein said lower leg defines a cutaway region and two of said fastener openings, one on each opposite side of said cutaway region, wherein said cutaway region is aligned with said openings of said bottom surfaces of said perimeter housing and said inner frame, and wherein said mounting bracket further comprises a pair of thumbscrews extending through said fastener openings and into said threaded bores at said bottom surface of said housing for securing said lower leg to said bottom surface of said housing.

9. A modular electrical power system comprising the plug-in power distribution unit of claim 1, wherein said modular electrical power system further comprises a modular receiving connector configured for releasable connection to said modular electrical power output connector, and a cord coupled to said modular receiving connector, said cord configured for routing in an exposed location in a work area.

10. A plug-in power distribution unit comprising:
    a housing defining an interior chamber, said housing comprising a top surface, a bottom surface, opposing side surfaces, a front surface, and a rear surface;
    an inner frame mounted within said interior chamber, wherein said inner frame is coupled to said rear surface via fasteners;
    a conventional electrical power-receiving plug projecting from a rear surface of said housing, said power-receiving plug configured for engaging a conventional high-voltage AC electrical outlet;
    a modular electrical power output connector at said housing;
    a plurality of electrical conductors extending from said power-receiving plug, through said interior chamber, to said modular electrical power output connector; and a mounting bracket coupled to said housing and extending along said rear surface, said mounting bracket comprising:
  an upper leg extending along said rear surface of said housing, said upper leg defining an opening for receiving a fastener to secure said upper leg to a threaded bore in a conventional high-voltage AC electrical outlet; and
  a lower leg extending along a bottom surface of said housing, wherein said lower leg defines an opening for receiving a fastener to secure said lower leg to a threaded bore at said bottom surface;
wherein said bottom surface of said housing and a bottom surface of said inner frame define respective openings through which said modular electrical power output connector extends.

11. The plug-in power distribution unit of claim 10, wherein said lower leg defines a cutaway region for receiving said modular electrical power output connector, and further defines one of said openings for receiving a fastener on opposite sides of said cutaway region, said mounting bracket further comprising a pair of thumbscrews for securing said lower leg to said bottom surface of said housing.

12. The plug-in power distribution unit of claim 10, further comprising a circuit breaker disposed along one of said electrical conductors, wherein said circuit breaker is accessible along said housing.

13. A plug-in power distribution unit comprising:
  a housing defining an interior chamber, said housing comprising a top surface, a bottom surface, opposing side surfaces, a front surface, and a rear surface;
  an inner frame mounted within said interior chamber, wherein said inner frame is coupled to said rear surface via fasteners;
  a conventional electrical power-receiving plug projecting from a rear surface of said housing, said power-receiving plug configured for engaging a conventional high-voltage AC electrical outlet;
  a modular electrical power output connector at said housing;
  a plurality of electrical conductors extending from said power-receiving plug, through said interior chamber, to said modular electrical power output connector;
  a circuit breaker disposed along one of said electrical conductors, wherein said circuit breaker is accessible along one of said surfaces of said housing; and
  a mounting bracket coupled to said housing and extending along said rear surface, said mounting bracket comprising:
    an upper leg extending along said rear surface of said housing, said upper leg defining an opening for receiving a fastener to secure said upper leg to a threaded bore in a conventional high-voltage AC electrical outlet;
    a lower leg extending along a bottom surface of said housing, wherein said lower leg defines an opening for receiving a fastener to secure said lower leg to a threaded bore at said bottom surface, and said lower leg defines a cutaway region for receiving said modular electrical power output connector, and further defines one of said openings for receiving a fastener on opposite sides of said cutaway region; and
    said mounting bracket further comprises fasteners for securing said lower leg to said bottom surface of said housing;
  wherein said bottom surface of said housing and a bottom surface of said inner frame define respective openings through which said modular electrical power output connector extends.

14. The plug-in power distribution unit of claim 13, wherein said fasteners for securing said lower leg to said bottom surface of said housing comprise a pair of thumbscrews.

15. The plug-in power distribution unit of claim 13, wherein said conventional electrical power-receiving plug comprises a pair of spaced-apart NEMA plugs configured for simultaneous engagement with two spaced-apart NEMA receptacles of the conventional high-voltage AC electrical outlet.

16. A modular electrical power system comprising the plug-in power distribution unit of claim 13, wherein said modular electrical power system further comprises a modular receiving connector configured for releasable connection to said modular electrical power output connector, and a cord coupled to said modular receiving connector, said cord configured for routing in an exposed location in a work area.

* * * * *